United States Patent [19]

Hossain

[11] Patent Number: 5,413,678
[45] Date of Patent: May 9, 1995

[54] HEATED SC1 SOLUTION FOR SELECTIVE ETCHING

[75] Inventor: Sylvia Hossain, Dallas, Tex.

[73] Assignee: Texas Instruments Incorporated, Dallas, Tex.

[21] Appl. No.: 61,787

[22] Filed: May 14, 1993

[51] Int. Cl.$^6$ .............................................. B05D 5/00
[52] U.S. Cl. .................................. 156/657.1; 252/79.1
[58] Field of Search ..................... 156/657, 662, 663; 252/79.1

[56] References Cited

U.S. PATENT DOCUMENTS

| | | | |
|---|---|---|---|
| 4,867,799 | 9/1989 | Grebinski | 134/11 |
| 4,940,509 | 7/1990 | Tso et al. | 156/657 X |
| 4,948,757 | 8/1990 | Jain et al. | 156/657 X |
| 5,127,984 | 7/1992 | Hua et al. | 156/640 X |
| 5,143,103 | 9/1992 | Basso et al. | 134/1 X |
| 5,147,499 | 9/1992 | Szwejkowski et al. | 156/662 X |

FOREIGN PATENT DOCUMENTS

| | | |
|---|---|---|
| 84475 | 7/1981 | Japan . |
| 235337 | 9/1989 | Japan . |

OTHER PUBLICATIONS

Cleaning Solutions Based on Hydrogen Peroxide for Use in Silicon Semiconductor Technology, by W. Kern, RCA Laboratories, Princeton, N.J., RCA Review, Jun. 1970, 187–206.

*Primary Examiner*—Thi Dang
*Attorney, Agent, or Firm*—Douglas A. Sorensen; Richard L. Donaldson; William E. Hiller

[57] ABSTRACT

$NH_4OH:H_2O_2:H_2O$ solution is used for selective wet etching of different films such as TEOS oxide, borophosphosilicate glass (BPGS), nitride, doped polysilicon, and thermal oxide.

6 Claims, No Drawings

HEATED SC1 SOLUTION FOR SELECTIVE ETCHING

BACKGROUND OF THE INVENTION

Until now, wet etching of polycrystalline silicon (polysilicon), both doped and in-situ doped, has been accomplished using chemicals such as choline. Wet etching of silicon nitride has been done using hot phosphoric acid. Both solutions have very fast etch rates for their respective films. Controlled etching of either poly silicon or silicon nitride has been very difficult. Therefore, a need exists for a method of controlled etching of polysilicon and silicon nitride.

SUMMARY OF THE INVENTION

A method of etching material from a surface of a substrate is disclosed which comprises heating a SC1 solution to a predetermined temperature, exposing the surface of said substrate to the heated SC1 solution, and then drying the substrate.

DETAILED DESCRIPTION OF THE INVENTION

The invention provides a method for the controlled etching of poly silicon and silicon nitride. This controlled etching is accomplished using heated $NH_4OH$:$H_2O_2$:$H_2O$, a solution referenced herein as SC1 solution. One possible ratio of SC1 solution used for etching polysilicon and silicon nitride films is 1:2:10 by volume. SC1 has been used in the past to remove particulate residue such as that left by photoresist and organic contamination after using certain photo resist removal techniques. However, SC1 has not been used previously to etch polysilicon and poly nitride films. The invention is particularly useful in etching polysilicon and silicon nitride films which lie on a substrate such as semiconductor wafers. Such etching can be accomplished according to the following method.

1. The substrates or wafer surfaces are exposed to a heated SC1 chemical solution. Note that the exposing step can include immersion in a SC1 chemical bath, spraying with the SC1 solution, or placement of the substrate or wafer in an SC1 vapor.
2. Next, the substrates or wafers are rinsed using deionized $H_2O$.
3. Lastly, the substrates or wafers are dried. For instance, a spin dryer can be used.

In the preferred embodiment of the invention, the temperature of the SC1 solution is heated to a temperature in the range of 40° C. to 80° C. and such solution is allowed to equilibrate for longer than 1 minute before being used. During experimental testing of the invention, the wafers were rinsed using a rinse tank located in a manual, bottle filled wet chemical hood. The material of the deionized $H_2O$ rinse tank is PVDF (polyvinylidene fluoride) and it is a quick dump/overflow tank with overflow option being used for the experimental testing. The wafers were moved manually from the process chemical bath (SC1) to $H_2O$ rinse tank. A water heater was used to heat the rinse water to about 60° C. Once the rinse cycle was complete, the wafers were dried using the spin drying technique in a commercially available spin rinse dryer. The wafer substrates used for the experiments were p-type <100>, 150mm CZ silicon. The polycrystalline silicon and the silicon nitride were deposited on the silicon wafers to obtain test results to measure the effectiveness of the film etch.

Silicon nitride, undoped polysilicon, and In-Situ Doped (ISD) polysilicon were deposited using an LPCVD (low pressure chemical vapor deposition) process in a vertical furnace. ISD polysilicon is doped with phosphine during the deposition of polycrystalline silicon in the furnace. The ISD polysilicon wafers used in the experiments were annealed using a rapid thermal annealing process after the deposition. The invention can also be used to etch oxides, such as silicon dioxide, borophosphosilicate glass (BPSG), and TEOS (tetraorthosilicate) oxide. In connection with experimental testing, the following oxides were placed upon silicon wafers as follows. Silicon dioxide was grown on a wafer using a thermal process at 900° C. BPSG was deposited on a wafer using an APCVD (atmospheric pressure chemical vapor deposition) process. The content of the BPSG was 4.3% by weight boron and 5.7% by weight phosphorous. The BPSG was also densified using a conventional thermal furnace process. TEOS oxide was deposited using an LPCVD process in a horizontal furnace.

Table 1 shows the etch rates of the following materials. All temperatures are expressed in Celsius (C).

TABLE 1

| MATERIAL | Å/min.@40° | Å/min.@50° | Å/min.@60° | Å/min.@80° |
|---|---|---|---|---|
| TEOS | 0.6 | 2.2 | 4.4 | 14.1 |
| $Si_2$ | 0.1 | 0.3 | 1.2 | 1.9 |
| BPSG | 7.5 | 11.8 | 28.8 | 83.3 |
| CVD $Si_3N_4$ | 0.0 | 0.0 | 0.3 | 0.7 |
| ISD POLY | 0.0 | 0.1 | 0.7 | 5.4 |
| ISD POLY* | 0.5 | 0.8 | 1.5 | 5.4 |
| POLY# | 0.0 | 0.6 | 1.2 | 5.0 |

*Un-annealed ISD polysilicon
Un-doped polysilicon

Note that the exact etch rates shown in Table 1 may vary depending on the exact film composition, age of chemicals used, exact temperature, and exact composition of chemicals.

The experimental results obtained show that SC1 solution heated to 40°, 50°, 60°, and 80° C. has several possible applications. By changing the temperature of the solution, varying the dip time, or by varying the ratio of the solution, selective wet etching is possible. Selective wet etching will allow the use of very clean and pure chemicals to obtain undercutting on a patterned structure or to remove undesirable films from a wafer surface. Heated SC 1 can also be used to remove filaments of films such as ISD polysilicon or oxide from a patterned structure where etch isotropy is needed. Until now, there were few options for etching certain films such as ISD polysilicon. Using SC 1 at higher temperatures and stronger concentrations, removal of polysilicon without noticeable etching or damage of backside silicon is possible.

By using a heated SC 1 solution and varying the SC 1 solution temperature, the etch time, and the ratio of the SC1 chemicals, it is now easy to obtain very controlled etching of both polysilicon and silicon nitride. The etch rate can be controlled to within 20 Å or so for polysilicon and under 10 Å for silicon nitride.

The controlled etch rate afforded by the invention, is extremely useful for several applications such as removing polysilicon filaments formed after a plasma anisotropic etch. These poly filaments form electrical connections between different parts of a semiconductor device and can cause reliability failures.

Other possible applications of the invention are as follows:

Using heated SC1 to remove surface defects on either polysilicon or silicon nitride by undercutting the defects and lifting them off.

Removing any of the above films, monolayer or more at one time and studying the films' properties.

Etching selectively through a structure for failure analysis purposes. Top-down pictures of the structure can then be obtained.

Using the etching properties to remove residues of the films in cases where the plasma etch selectivity between the different films is not high enough.

Although the invention has been described in detail herein with reference to its preferred embodiment and certain described alternatives, it is to be understood that this description is by way of example only, and it is not to be construed in a limiting sense. It is to be further understood that numerous changes in the details of the embodiments of the invention, and additional embodiments of the invention may be made by persons of ordinary skill in the art having reference to this description. The ratio of the SC1 solution may be changed to increase the efficiency of the wet etch. It is contemplated that all such changes and additional embodiments are within the spirit and true scope of the invention as claimed below.

I claim:

1. A method of etching silicon nitride from a surface of a semiconductor wafer, comprising:

heating $NH_4OH:H_2O_2:H_2O$ to a predetermined temperature;

exposing said surface of said wafer to the heated $NH_4OH:H_2O_2:H_2O$; and drying said substrate.

2. A method as recited in claim 1 wherein said predetermined temperatures are in the range of 40° C. to 80° C.

3. A method as recited in claim 1 wherein said substrate is dried in a spin dryer.

4. A method as recited in claim 1 wherein said step of exposing said surface includes immersing said substrate in said heated $NH_4OH:H_2O_2:H_2O$.

5. A method as recited in claim 1 wherein said step of exposing said surface includes spraying said substrate surface with said heated $NH_4OH:H_2O_2:H_2O$.

6. A method as recited in claim 1 wherein said step of exposing said surface includes placing said surface in $NH_4OH:H_2O_2:H_2O$ vapor.

* * * * *